United States Patent
Lin et al.

[11] Patent Number: 6,100,191
[45] Date of Patent: Aug. 8, 2000

[54] METHOD FOR FORMING SELF-ALIGNED SILICIDE LAYERS ON SUB-QUARTER MICRON VLSI CIRCUITS

[75] Inventors: Tony Lin, Kaohsiung; Water Lur, Taipei; Jiun-Yuan Wu, Hsinchu; Hsiao-Lin Lu, Taipei, all of Taiwan

[73] Assignee: United Microelectronics Corp., Hsinchu, Taiwan

[21] Appl. No.: 09/059,687

[22] Filed: Apr. 14, 1998

[51] Int. Cl.[7] .................................................. H01L 21/44
[52] U.S. Cl. ........................ 438/661; 438/664; 438/666; 438/674; 438/683
[58] Field of Search .................................... 438/649, 655, 438/661, 664, 683, 666, 674, 592; 257/770

[56] References Cited

U.S. PATENT DOCUMENTS

| | | | |
|---|---|---|---|
| 4,873,204 | 10/1989 | Wong et all | 438/649 |
| 4,873,205 | 10/1989 | Critchlow et al. | 438/647 |
| 5,494,860 | 2/1996 | McDevitt et al. | 438/625 |
| 5,668,065 | 9/1997 | Lin | 438/303 |
| 5,691,212 | 11/1997 | Tsai et al. | 438/297 |
| 5,756,391 | 5/1998 | Tsuchiaki | 438/592 |
| 5,759,899 | 6/1998 | Saito | 438/303 |
| 5,966,607 | 10/1999 | Chee et al. | 438/305 |

*Primary Examiner*—Wael Fahmy
*Assistant Examiner*—Kurt Eaton

[57] ABSTRACT

The present invention discloses a method to manufacture a self-aligned silicide layer on a substrate. A metal oxide semiconductor (MOS) device and a shallow trench are fabricated in the substrate. The device has a gate structure, spacers of the gate structured and doping regions. The shallow trench is refilled with silicon oxide material for isolation. A silicon layer is nonconformally deposited on the top surface of the gate structure, the spacers and the doping regions by using a physical vapor deposition (PVD) process, such as ion metal plasma (IMP) process. The IMP process, like a sputtering process, is to ionize a silicon material or a refractory-metal material to silicon ions or metal ions and the ions are biased to anisotropically deposit on the top surface of the substrate. A refractory metal layer is defined on the top surface of the silicon layer by the IMP technology. A two-step thermal annealing process, such as rapid thermal annealing (RTA) process is performed to convert the silicon layer and the refractory metal layer into a silicide layer. Since the silicon layer serves as a silicon source for the salicide process, the silicide layer can form on the spacers and the silicon oxide material of the trench.

8 Claims, 3 Drawing Sheets

METHOD FOR FORMING SELF-ALIGNED SILICIDE LAYERS ON SUB-QUARTER MICRON VLSI CIRCUITS

FIELD OF THE INVENTION

The present invention relates to a self-aligned silicide technology for sub-micron VLSI circuits, and more specifically, to a salicide technology without narrow-linewidth effect for sub-quarter micron VLSI circuits with the formation of local interconnection.

BACKGROUND OF THE INVENTION

A self-aligned silicide (salicide) technology is used for the metal contact of devices without any additional mask. A conventional salicide technology will be described as below with reference to FIGS. 1 to 3.

Referring to FIG. 1, a cross sectional view of a substrate 100 is demonstrated. A metal oxide semiconductor field effect transistor (MOSFET) and a shallow trench 110 are fabricated in the substrate 100. The silicon oxide material is refilled into the trench 110 for isolation. The MOSFET in the substrate has a gate structure 120, spacers 140 of the gate structure and doping regions 130 to be the source/drain region of the MOSFET. The substrate 100 is a silicon substrate and the spacers 140 are formed of silicon oxide material.

As being shown in FIG. 2, a metal layer 150 is conformally formed on the MOSFET and the substrate 100 by physical vapor deposition (PVD) process, such as sputtering. The metal layer is formed of a refractory metal and it is selected from the group of titanium (Ti) metal, platinum (Pt) metal and cobalt (Co) metal. Afterwards, the substrate 100 is performed by a two-step rapid thermal annealing (RTA) process to convert the metal layer 150 into a silicide layer 160. The metal layer 150 is reacted with silicon atoms to form the silicide layer 160. The silicide layer 160 is formed on the top surface of the gate structure 120, the doping region 130 and the substrate 100. Besides, the metal layer 150 will not react with the silicon oxide material, for example, the spacers 140 of the gate structure 120 and the trench isolation. The bridging between the gate structure 120 and the doping region 130 is eliminated without any etch-back process. After the formation of the silicide layer 160, the residual metal layer 150 on the spacer 140 and the shallow trench 110 are removed by using an etchant, which will not attack the silicide layer 160.

It is easy to manufacture the metal contacts of the active region of a device by using salicide technology. Thus, as device being scaled down to sub-quarter micron, a narrow-linewidth effect is occurred in the salicide process. Referring to FIG. 3 again, in the sub-quarter integrated circuits, the gate structure 120 has a width W2 about 0.25 micron meters and the gate structure 120 with spacer 140 has a width about 0.4 micron meters. The width W2 is too small so as, that the silicide layer 160 is hard to be formed on the gate structure 120.

According to the above discussions, a new salicide technology is needed to form a silicide layer on the narrow gate structure of a device for sub-quarter micron integrated circuit. cl SUMMARY OF THE INVENTION A method for manufacturing a silicide layer on a substrate is disclosed in the present invention. A substrate is provided with a MOSFET and a trench. The trench is refilled with insulating material for isolation. The MOSFET has a gate, two doping regions and spacers of the gate structure.

Then, a silicon layer is anisotropically deposited on the top surface of the device and the substrate by using ion metal plasma (IMP) technology. A refractory metal is deposited on the silicon layer. After the silicon layer and the metal layer are formed, a two-step thermal annealing process, such as rapid thermal annealing (RTA) process, is performed to form a silicide layer.

The silicide layer is formed on the top surface of the device and the substrate. Specifically, the silicide layer can be formed on the spacers and the insulating material of the trench in spite that the spacers and the insulating material are formed of silicon oxide material. Since the silicon layer serves as a silicon source for the salicide process, the silicide layer can form on the silicon oxide material.

In addition to the above benefits, the present invention has several benefits. The first benefit is that the narrow-linewidth phenomenon for sub-quarter micron integrated circuits is eliminated. The second benefit is that the local interconnect is formed during the salicide process. The third benefit is that a borderless contact hole is used for sub-quarter micron integrated circuits. The fourth benefit is that the salicide process is not influenced by the doping polarity of the active region of integrated circuits. Additionally, as the formation of the silicide layer on the source/drain regions may not reduce the depth of the source/drain regions, a junction leakage in the source/drain regions could be eliminated.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a salicide technology for sub-quarter integrated circuit is disclosed. A silicide layer could be formed on the silicon oxide layer without the bridging between the active regions of a device in the present invention. As the formation of the silicide layer on the silicon oxide material, the local interconnection could be manufactured over a shallow trench isolation. The metal contact of the devices, which is fabricated by using the present invention, has a larger area than that of the devices, which is manufactured by a conventional salicide technology, so that the contact hole of the active region of devices in the present invention is easily aligned.

Figure 1:
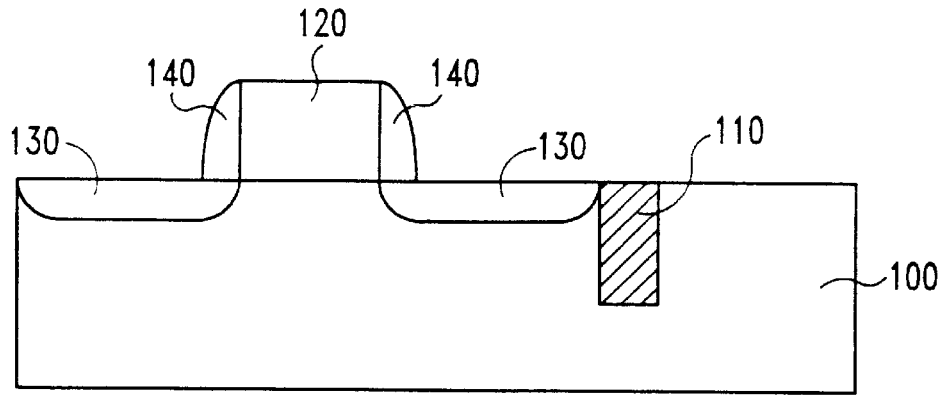
FIGS. 1 shows a cross sectional view of a substrate having a shallow trench and a device in accordance with prior art.
Figure 2:
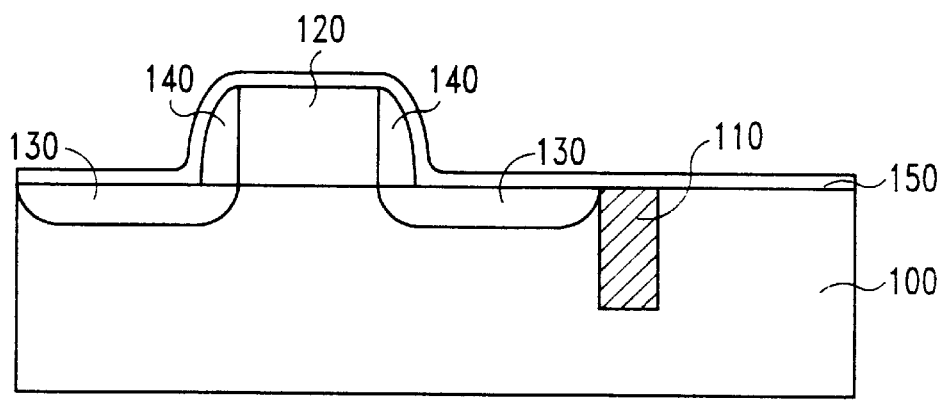
FIG. 2 shows that a metal layer is conformal deposited on a substrate in accordance with prior art.
Figure 3:
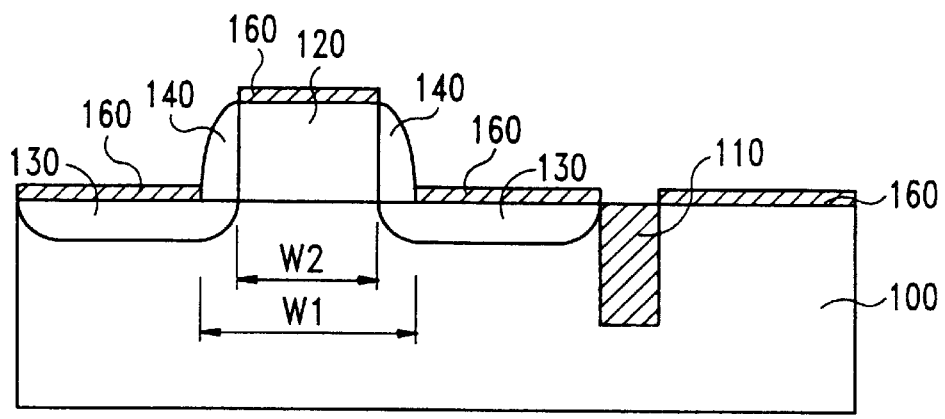
FIG. 3 shows the formation of salicide films in accordance with prior art.
Figure 4:
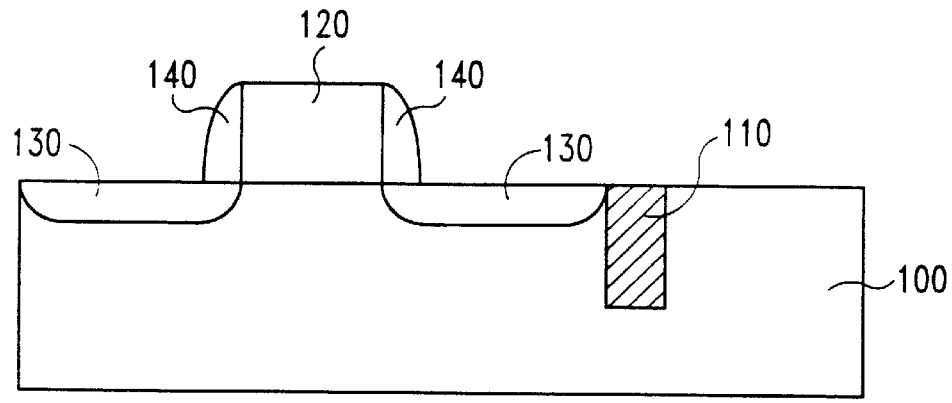
FIG. 4 shows a cross sectional view of a substrate having a shallow trench and a device in accordance with the present invention.

Referring to FIG. 4, a single-crystal silicon substrate 100 with a <100> crystallographic orientation is used for the preferred embodiment. A device is manufactured on the substrate 100 and it has a gate structure 120, doping regions 130 to serve as the source/drain regions of the device and the spacers 140 of the gate structure 120. A shallow trench isolation 110 is formed beside the device for isolation. The shallow trench isolation 110 is a shallow trench that silicon oxide material is refilled into. The spacers 140 are formed of silicon oxide material.

Figure 5:
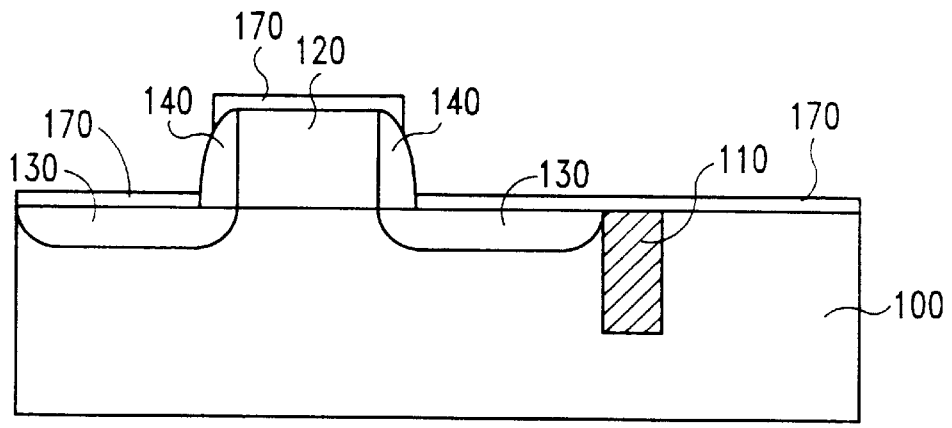
FIG. 5 shows the formation of a silicon layer on the top surface of a device and a substrate in accordance with the present invention.

Referring to FIG. 5, a silicon layer 170 is deposited on the top surface of the gate structure 120, the doping region 130 and the substrate 100. The silicon layer 170 is formed by using an ion metal plasma (IMP) technology, like a physical vapor deposition (PVD) process. The silicon atoms of a target are ionized to silicon ions and the ions are then accelerated by a bias that is between the target and the substrate 100. The ions are anisotropically deposited on the substrate. Thus, the silicon layer 170 is formed on the top surface of the device on the substrate 100 and the substrate 100. In a case, the silicon layer 170 has a thickness between about 300 to 700 angstroms.

Figure 6:
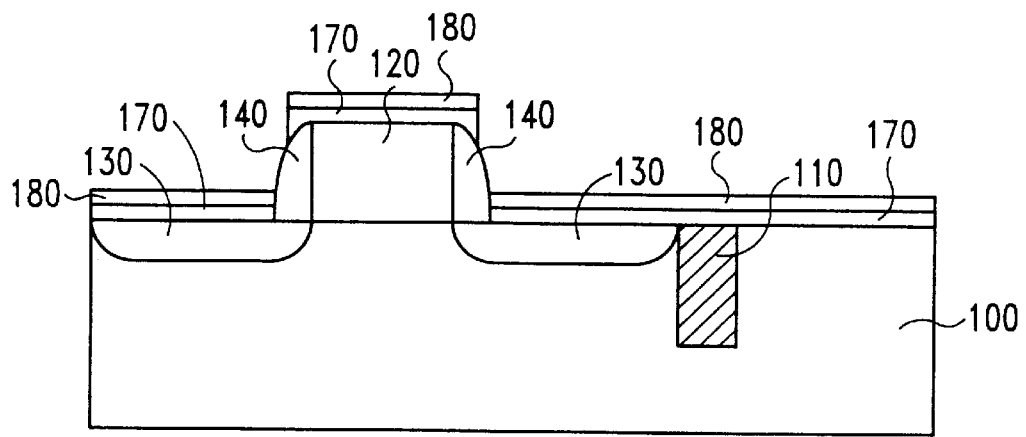
FIG. 6 shows the formation of a metal layer on a silicon layer in accordance with the present invention.

Turning to FIG. 6, a metal layer 180 is deposited on the silicon layer 170 by using ion metal plasma (IMP) process. The metal layer 180 is selected from a group of titanium (Ti) metal, platinum (Pt) metal and the cobalt (Co) metal. In a preferred embodiment, the thickness of the metal layer 180 is between about 200 to 500 angstroms.

Following the deposition of the metal layer 180 on the silicon layer 170, a two-step thermal processing is performed on the substrate 100. The metal layer 180 and the silicon layer 170 react upon each other to form a silicide layer 190. During the first step, the temperature is kept at between about 600 to 700 degrees centigrade. A second temperature step of between about 750 to 850 degrees centigrade is used to lower the sheet resistance of the silicide layer 190.

Alternatively, the thermal processing is done by a two-step rapid thermal annealing (RTA) process. The first-step RTA at 600–800 degrees centigrade in Ar (with the specific reaction time depending on the temperature selected), has also been used to effect the silicide formation. After the formation of the silicide layer 190, a stabilization anneal process of between about 1050 to 1350 degrees centigrade for 30 seconds in Ar is conducted to reduce the silicide resistivity.

Referring to FIG. 7 again, the silicide layer 190 is formed on the top surface of the substrate 100 and the device on the substrate 100, since the silicon layer 170 is covered onto the top surface. The silicon layer 170 serves as a silicon source for the salicide process. Thus, the top surface of the spacers 140 is covered by the silicide layer 190. Since the silicided layer 190 can be formed on the wider top surface of the gate structure 120 and the spacers 140 than that of the gate structure 120, the narrow-linewidth phenomena could be eliminated. Additionally, the shallow trench isolation 190 is covered by the silicide layer 190 to serve as a local interconnect line, in spite that the plug of the shallow trench isolation 110 is formed of silicon oxide material.

Figure 7:
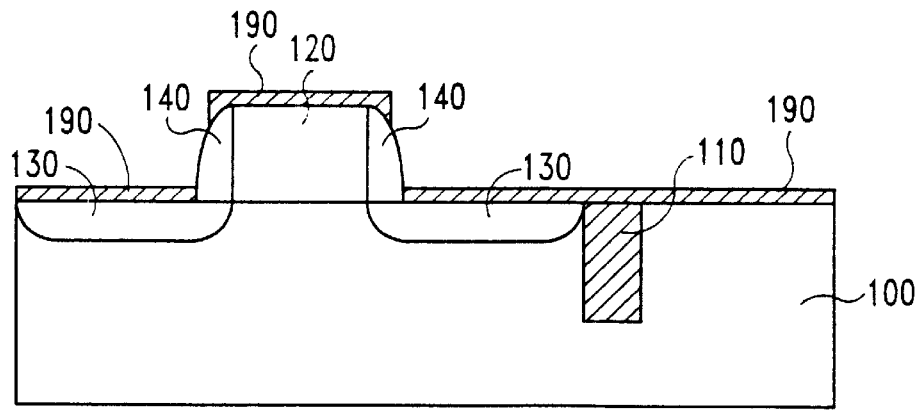
FIG. 7 shows the formation of a silicide layer on the top surface of a device and a substrate in accordance with the present invention.
Figure 8:
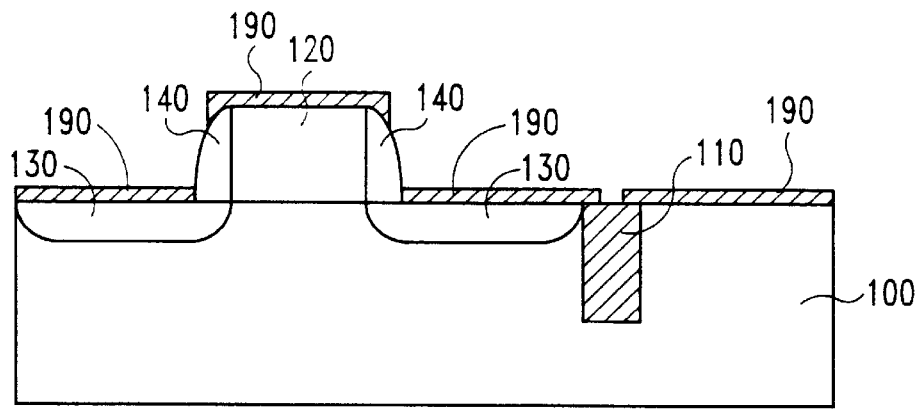
FIG. 8 shows that a silicide layer on a shallow trench is etched back in accordance with the present invention.

If an array of devices is defined on the substrate 100, the local interconnect line of the device on the substrate 100 may be opened, that is opposite to FIG. 7. That is, the silicide layer 190 on the shallow trench isolation 110 is etched back, as being shown in FIG. 8.

Figure 9:
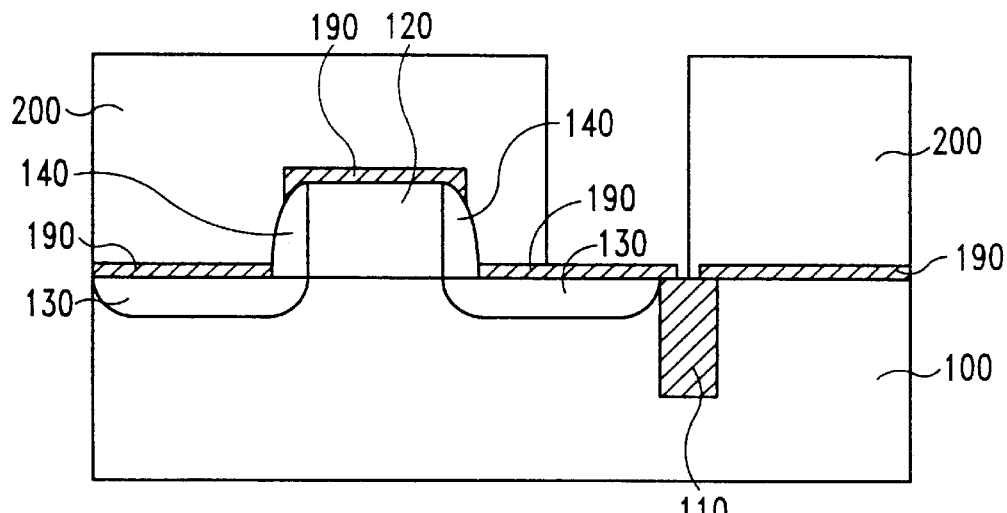
FIG. 9 shows the formation of the contact hole of a silicide layer in a dielectric layer in accordance with the present invention.

Because the broader metal contact of MOSFET is formed in the present invention, a broaderless contact hole could be used for the active region of the MOSFET. Referring to FIG. 9, the formation of a contact hole in an intermetal dielectric layer 200 is demonstrated. The intermetal dielectric (IMD) layer 200 is deposited by conventional chemical vapor deposition (CVD) process and it is formed of silicon oxide material. The IMD layer 200 is etched back to form a contact hole in the IMD layer 200 for the doping regions 130. Since the metal contact, the silicide layer 190, of the doping regions 130 in the present invention is wider than that in prior art, the contact hole is easily aligned the doping region 130 and a broad contact hole do not be needed. If the contact hole of devices has a narrow aperture, there are no area penalties in integrated circuits.

According to the above discussion, there are several benefits in the present invention. The first benefit is that the narrow-linewidth phenomenon for sub-quarter micron integrated circuits is eliminated. The second benefit is that the local interconnect is formed during the salicide process of the present invention. The third benefit is that a borderless contact hole is used for sub-quarter micron integrated circuits. The fourth benefit is that the salicide process is not influenced by the doping polarity of the active region of integrated circuits. Additionally, as the formation of the silicide layer on the source/drain regions may not reduce the depth of the source/drain regions, a junction leakage in the source/drain regions could be eliminated.

While the preferred embodiment of the invention has been illustrated and described, it will be appreciated that various changes can be made therein without departing from the spirit and scope of the invention.

What is claimed is:

1. A method to manufacture self-aligned silicide layer on a substrate, the method comprising the steps of:

forming a device having a gate structure, spacers of said gate structured and doped regions, on said substrate;

forming a silicon layer on a top surface of said gate structure, only on a top surface of said spacers and said doped region;

forming a refractory metal on said silicon layer; and performing a two-step rapid thermal annealing (RTA) process to convert said silicon layer and said refractory metal layer into a silicide layer, wherein said silicide layer covers said top surface of said gate structure, said top surface of said spacers without covering side surfaces thereof, and also covers said doped regions so as that said silicide layer has a larger area than said too surface of said gate structure.

2. The method of claim 1, wherein said silicon layer is deposited by using ion metal plasma (IMP) technology.

3. The method of claim 1, wherein said silicon layer has a thickness between about 300 to 700 angstroms.

4. The method of claim 1, wherein said metal layer is deposited by using ion metal plasma (IMP) technology.

5. The method of claim 1, wherein said refractory metal layer is selected from a group consisting of titanium (Ti) metal, cobalt (Co) metal and platinum (Pt) metal.

6. The method of claim 1, wherein said refractory metal layer has a thickness between about 200 to 500 angstroms.

7. The method of claim 1, wherein a first-step RTA process of said two-step RTA process is performed at an annealing temperature between about 600 to 800 degrees centigrade.

8. The method of claim 1, wherein a second-step RTA process of said two-step RTA process is performed at an annealing temperature between about 1050 to 1350 degrees centigrade.

\* \* \* \* \*